(12) United States Patent
Takahashi et al.

(10) Patent No.: US 9,882,310 B2
(45) Date of Patent: Jan. 30, 2018

(54) CONNECTION STRUCTURE AND APPARATUS UNIT

(71) Applicant: OMRON Corporation, Kyoto (JP)

(72) Inventors: Kei Takahashi, Moriyama (JP); Shunji Eto, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/384,239

(22) Filed: Dec. 19, 2016

(65) Prior Publication Data

US 2017/0244197 A1    Aug. 24, 2017

(30) Foreign Application Priority Data

Feb. 18, 2016 (JP) .................................. 2016-029086

(51) Int. Cl.
| | |
|---|---|
| *H01R 4/50* | (2006.01) |
| *H01R 13/639* | (2006.01) |
| *H01R 13/514* | (2006.01) |
| *H02G 3/08* | (2006.01) |
| *H05K 7/14* | (2006.01) |

(52) U.S. Cl.
CPC ......... *H01R 13/639* (2013.01); *H01R 13/514* (2013.01); *H02G 3/083* (2013.01); *H05K 7/1432* (2013.01); *H05K 7/1465* (2013.01)

(58) Field of Classification Search
CPC .................................................... H01R 13/629
USPC ................. 439/341, 376, 247, 248
See application file for complete search history.

(56) References Cited

U.S. PATENT DOCUMENTS

| | | | | |
|---|---|---|---|---|
| 3,425,025 A | * | 1/1969 | Williams | ............. H01R 13/629 361/600 |
| 3,969,796 A | * | 7/1976 | Hodsdon | ............. H01M 2/1022 24/270 |
| 4,501,460 A | * | 2/1985 | Sisler | ..................... G06F 1/181 361/679.58 |
| 4,546,267 A | * | 10/1985 | Urfirer | ................... H01R 13/22 307/116 |
| 4,558,914 A | * | 12/1985 | Prager | ................. H05K 7/1441 361/679.4 |
| 4,688,864 A | * | 8/1987 | Sorel | ..................... H05K 7/023 361/730 |

(Continued)

FOREIGN PATENT DOCUMENTS

| | | |
|---|---|---|
| EP | 2913917 | 9/2015 |
| JP | 2014-193002 | 10/2014 |
| WO | 2014132411 | 9/2014 |

OTHER PUBLICATIONS

"Search Report of Europe Counterpart Application", dated Jul. 4, 2017, p. 1-p. 9.

*Primary Examiner* — Neil Abrams
(74) *Attorney, Agent, or Firm* — JCIPRNET

(57) ABSTRACT

The present invention provides a connection structure and an apparatus unit that can avoid damage to connectors when the connectors are caused to be connected to each other. Through rotation of a first option unit towards an inverter body, the connection structure connects a first connector disposed in the inverter body and a second connector disposed in the first option unit, and the first connector and the second connector are floating connectors. The first option unit includes an engaging portion for engaging the engaging support portion in a wall of the inverter body.

7 Claims, 12 Drawing Sheets

(56) References Cited

U.S. PATENT DOCUMENTS

| | | | | |
|---|---|---|---|---|
| 4,709,974 A * | 12/1987 | Hawkins | H01M 2/1022 | 439/341 |
| 4,718,858 A * | 1/1988 | Godfrey | G06F 1/181 | 361/732 |
| 4,738,632 A | 4/1988 | Schmidt et al. | | |
| 4,950,178 A * | 8/1990 | Harvey | H01R 31/08 | 439/247 |
| 4,969,830 A * | 11/1990 | Daly | G06F 1/1632 | 200/50.1 |
| 5,097,388 A * | 3/1992 | Buist | G06F 1/18 | 361/679.4 |
| 5,136,229 A * | 8/1992 | Galvin | H01M 2/1022 | 320/112 |
| 5,148,353 A * | 9/1992 | Morgan | G06F 1/183 | 361/726 |
| 5,227,953 A * | 7/1993 | Lindberg | G06F 1/1632 | 361/679.41 |
| 5,645,434 A * | 7/1997 | Leung | H01R 23/6873 | 361/735 |
| 5,737,189 A * | 4/1998 | Kammersgard | G06F 1/18 | 312/107.5 |
| 5,841,639 A * | 11/1998 | Schnoor | H05K 5/0021 | 361/679.32 |
| 5,876,218 A * | 3/1999 | Liebenow | H05K 5/0273 | 439/74 |
| 5,926,627 A * | 7/1999 | Sugimura | G06F 1/1632 | 361/679.42 |
| 6,038,130 A * | 3/2000 | Boeck | H01R 9/2675 | 361/729 |
| 6,135,801 A * | 10/2000 | Helot | G06F 1/1632 | 439/341 |
| 6,151,218 A * | 11/2000 | Pirdy | G06F 1/1632 | 361/679.41 |
| 6,155,857 A * | 12/2000 | Kato | H01R 13/74 | 439/247 |
| 6,172,875 B1 * | 1/2001 | Suzuki | G06F 1/183 | 361/679.4 |
| 6,461,201 B1 * | 10/2002 | Maeda | H01R 13/514 | 439/680 |
| 6,549,416 B2 * | 4/2003 | Sterner | G06F 1/1632 | 361/679.43 |
| 6,607,408 B2 * | 8/2003 | Milan | G06F 13/4095 | 361/732 |
| 6,692,310 B2 * | 2/2004 | Zaderej | H01R 13/514 | 439/541.5 |
| 7,140,922 B2 * | 11/2006 | Luu | H01R 31/065 | 439/651 |
| 7,160,132 B2 * | 1/2007 | Phillips | B25F 5/02 | 439/341 |
| 7,494,418 B2 * | 2/2009 | Rifkin | G07F 17/32 | 463/46 |
| 7,500,880 B1 * | 3/2009 | Vaziri | H01R 31/005 | 439/638 |
| 7,534,126 B2 * | 5/2009 | Ozawa | H01R 12/71 | 439/353 |
| 8,014,170 B2 * | 9/2011 | Mori | F16L 3/13 | 174/53 |
| 8,226,444 B2 * | 7/2012 | Chow | H01R 13/514 | 439/651 |
| 8,391,014 B2 * | 3/2013 | Sung | G06F 1/1632 | 361/212 |
| 8,821,173 B2 * | 9/2014 | Carnevali | G06F 1/1632 | 361/679.41 |
| 8,876,540 B2 * | 11/2014 | Lavender | H01M 2/30 | 439/140 |
| 9,287,666 B2 * | 3/2016 | Walters | H01R 12/7005 | |
| 9,640,908 B2 * | 5/2017 | Mizrahi | H01R 13/629 | |
| 9,699,930 B2 * | 7/2017 | Miura | H05K 7/1474 | |
| 9,722,378 B2 * | 8/2017 | Hsu | H01R 31/065 | |
| 2006/0270284 A1 * | 11/2006 | Youden | H01R 31/065 | 439/717 |
| 2007/0058332 A1 * | 3/2007 | Canterbury | G06F 1/26 | 361/679.41 |
| 2008/0123894 A1 * | 5/2008 | Lu | H04R 1/403 | 381/394 |
| 2008/0164793 A1 | 7/2008 | Ozawa et al. | | |
| 2013/0102164 A1 * | 4/2013 | Sip | H01R 13/642 | 439/38 |
| 2016/0285219 A1 * | 9/2016 | Leverton | H01R 13/447 | |

* cited by examiner

CONNECTION STRUCTURE AND APPARATUS UNIT

CROSS-REFERENCE TO RELATED APPLICATION

This application claims the priority benefits of Japan patent application no. JP 2016-029086, filed on Feb. 18, 2016. The entirety of the above-mentioned patent application is hereby incorporated by reference herein and made a part of this specification.

BACKGROUND OF THE INVENTION

1. Field of the Invention

The present invention relates to a connection structure and an apparatus unit having connectors connected by using the connection structure, where the connection structure connects a connector disposed in a first frame member and a connector disposed in a second frame member mounted in the first frame member.

2. Description of Related Art

To add a new function to a main unit (main unit) such as an inverter (inverter), or to control a main unit, an option unit (option unit) (a second frame member) is generally mounted in the main unit (a first frame member). By means of a composition in such a manner that an option unit can be independent from the main unit, advantages such as adding various functions to the main unit and easily replacing or changing the option unit can be obtained.

If an option unit is mounted for the main unit, a connector connected to a printed board included in the main unit needs to be connected to a connector of a printed board included in the option unit, so that a connection structure used for connecting connectors to each other is known. A patent document 1 discloses an electrical connection box having connectors connected by using the connection structure.

The electrical connection box disclosed by the patent document 1 and used as an apparatus unit is an electrical connection box described as follows: relative to an electrical connection box body (a first frame member), a mounting body (a second frame member) is assembled by using a rotation operation, to connect the connectors. The electrical connection box is disposed in such a manner that in a state in which an edge angle portion on one side of an overlapped surface side of the mounting body used as an option unit presses against the bottom surface of a mounting recessed portion of the electrical connection box body used as a main unit, the mounting body is caused to rotate by using the edge angle portion of the side as a rotation shaft, and is provided with a fixing mechanism including a lock protruding portion and an insertion hole, where the lock protruding portion does not engage the insertion hole in a rotation start state of the mounting body, and on the other hand, the lock protruding portion engages the insertion hole in a rotation end state of the mounting body. In addition, the electrical connection box has the following connection structure: the mounting body is caused to rotate relative to the electrical connection box body, to connect a connector disposed in the electrical connection box body and a connector disposed in the mounting body. By means of the composition, a structure of the electrical connection box can be favorably simplified or miniaturized.

Prior Art Document

Patent Document

Patent Document 1: Japanese Patent Publication No. 2014-193002 Gazette (disclosed on Oct. 6, 2014)

SUMMARY OF THE INVENTION

However, in the electrical connection box disclosed by the patent document 1, the mounting body (the second frame member) is caused to rotate relative to the electrical connection box body (the first frame member), to connect the connector disposed in the electrical connection box body and the connector disposed in the mounting body. Therefore, when the connectors are to be connected to each other, the connector disposed in the mounting body is connected to the connector disposed in the electrical connection box body in a state of inclining relative to the connector disposed in the electrical connection box body. As a result, burden is caused to the connector, and therefore, a problem of easy damage to the connector exists.

The present invention is accomplished in view of the problem, and is directed to providing a connection structure. In the connection structure in which a second frame member is caused to rotate towards a first frame member, to connect a connector disposed in the first frame member and a connector disposed in the second frame member, damage to the connectors can be avoided when the connectors are connected to each other.

The connection structure of the present invention is a connection structure that connects a first connector disposed on a first connection surface of the first frame member and a second connector disposed on a second connection surface of the second frame member, and the second frame member has a first engaging portion, the first frame member has an engaging support portion, where the engaging support portion engages the first engaging portion, so that the second frame member rotates by using an engaging position as a pivot point, the first connector and the second connector are connected by rotating the second frame member towards the first frame member, and the first connector and the second connector are floating connectors.

The first connector and the second connector are floating connectors. Therefore, in the connection structure in which the second frame member is caused to rotate relative to the first frame member, to connect the connector disposed in the first frame member and the connector disposed in the second frame member, when the first connector is caused to be connected to the second connector, no burden is caused to the first connector and the second connector. Therefore, damage to the first connector and the second connector can be avoided.

In the connection structure of the present invention, the following composition is used: the first engaging portion is disposed on the second connection surface, and the engaging support portion is disposed on the first connection surface.

According to the composition, an engaging position between the first engaging portion and the engaging support portion may be caused to be on a surface that is the same as a surface provided with the first connector and the second connector. Therefore, a position offset between the first connector and the second connector may be suppressed in a rotation action for connecting the first connector and the second connector.

In the connection structure of the present invention, the following composition is used: the second frame member has a second engaging portion on the second connection surface, where the second engaging portion is movable between a lock position and an unlock position, the first frame member has a second opening portion on the first connection surface, wherein the second opening portion allows insertion of the second engaging portion located in the unlock position, and when the first connector has been connected to the second connector, the second engaging portion engages a circumferential wall of the second opening portion by moving the second engaging portion to the lock position.

According to the composition, when the second frame member is caused to rotate towards the first frame member to connect the first connector and the second connector, the second engaging portion in an unlock position may be inserted into the second opening portion, and when the first connector has been connected to the second connector, the second engaging portion may be caused to move to the lock position, so that the second engaging portion engages the circumferential wall of the second opening portion. Therefore, in a state in which the first connector has been connected to the second connector, mounting of the second frame member relative to the first frame member may be fixed.

In the connection structure of the present invention, the second frame member has an operating portion, wherein the operating portion is movable between an open position and a close position, the second engaging portion moves from the unlock position to the lock position by moving the operating portion from the open position to the close position, the second frame member has two planes different from the second connection surface, and the operating portion is exposed outside each of the two planes.

According to the composition, if another object (for example, another frame member) exists on one of the two planes different from the second connection surface, and an operation cannot be performed on the operating portion from a side of the plane, an operation may be performed on the operating portion from a side of the other plane of the two planes different from the second connection surface.

In the connection structure of the present invention, the first connector is configured closer to an inner side than the first connection surface, and the second connector is configured protruding to an outer side compared with the second connection surface.

According to the composition, the first connector is configured closer to the inner side than the first connection surface, and the second connector is configured protruding to the outer side compared with the second connection surface. In this way, the second connector may be connected to the first connector. In addition, the first connector is configured closer to the inner side than the first connection surface, and therefore, when the second frame member is not mounted in the first frame member, the first connector does not protrude to the outside. As a result, when the second frame member is not mounted in the first frame member, damage caused by contact between the first connector and another object, the body of a user, or the like may be avoided.

In the connection structure of the present invention, the second frame member has, around the second connector, a wall portion protruding from the second connection surface to an outside, and the first frame member has, in a position on the first connection surface and opposite to the wall portion in a connected state, a wall portion insertion slot allowing insertion of the wall portion.

According to the composition, when the first connector is connected to the second connector, a position of the second connector relative to the first connector may be accurately located.

In the connection structure of the present invention, the second frame member has a rib on the second connection surface, and the first frame member has, in a position on the first connection surface and opposite to the rib in a connected state, a rib insertion hole allowing insertion of the rib.

According to the composition, when the first connector is connected to the second connector, the rib is inserted into the rib insertion hole. In this way, a position offset between the first frame member and the second frame member caused by shearing loading can be avoided.

An apparatus unit of the present invention is an apparatus unit having multiple frame members, wherein connectors between adjacent frame members are connected to each other by using any of the aforementioned connection structures.

The connector disposed in the multiple frame members are floating connectors. Therefore, when the connectors between the adjacent frame members are connected to each other, no burden is caused to the connectors. Therefore, damage to the connectors can be avoided.

An apparatus unit of the present invention is an apparatus unit having at least three frame members: a frame member A, a frame member B, and a frame member C, wherein the frame member A has a first surface adjacent to the frame member B, the frame member B has a second surface adjacent to the frame member A and a third surface adjacent to the frame member C, the frame member C has a fourth surface adjacent to the frame member B, connectors of the frame member A and the frame member B are connected to each other by using the connection structure according to any one of the aforementioned items in which the first surface is used as the first connection surface and the second surface is used as the second connection surface, connectors of the frame member B and the frame member C are connected to each other by using the connection structure in which the third surface is used as the first connection surface and the fourth surface is used as the second connection surface, the frame member C has a protrusion on the fourth surface, when the operating portion of the frame member B is in an open position, the protrusion interferes with a side of the third surface of the operating portion, and when the operating portion of the frame member B is in the close position, the protrusion does not interfere with a side of the third surface of the operating portion.

When an operating portion of a fixing mechanism of the frame member B is in an open position, the protrusion of the frame member C interferes with a side of the second surface of the operating portion of the frame member B, and therefore, the connectors of the frame member B and the frame member C cannot be connected. In this way, after the frame member B is mounted in the frame member A, a user can be prevented from forgetting to move the operating portion of the fixing mechanism of the frame member B to the lock position.

According to the present invention, in a connection structure in which a second frame member is caused to rotate relative to a first frame member, to connect a connector disposed in the first frame member and a connector disposed in the second frame member, damage to the connectors can be avoided when the connectors are connected to each other.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3(a) is a three-dimensional view obtained through viewing the first option unit from a side of a first side surface, and FIG. 3(b) is a three-dimensional view obtained through viewing the first option unit from a side of a second side surface.

FIG. 7(a) is a view showing a case before the first option unit is mounted in the inverter body, FIG. 7(b) is a view showing a case after the first option unit is mounted in the inverter body, and FIG. 7(c) is a view showing a case in which the first option unit has been fixed in the inverter body.

FIG. 9(a) is a three-dimensional view obtained through viewing the first option unit from a side of a first side surface, and FIG. 9(b) is a three-dimensional view obtained through viewing the first option unit from a side of a second side surface.

FIG. 11(a) is a view obtained through viewing from the bottom side a case in which the second option unit is mounted in the first option unit, FIG. 11(b) is an enlarged view of the fixing mechanism of the first option unit in FIG. 11(a), and FIG. 11(c) is an enlarged view of the fixing mechanism of the first option unit when the second option unit has been mounted in the first option unit.

FIG. 12(a) is a view obtained through viewing from the bottom side a case in which the second option unit is mounted in the first option unit, and FIG. 12(b) is an enlarged view of the fixing mechanism of the first option unit in FIG. 12(a).

DESCRIPTION OF THE EMBODIMENTS

Figure 1:
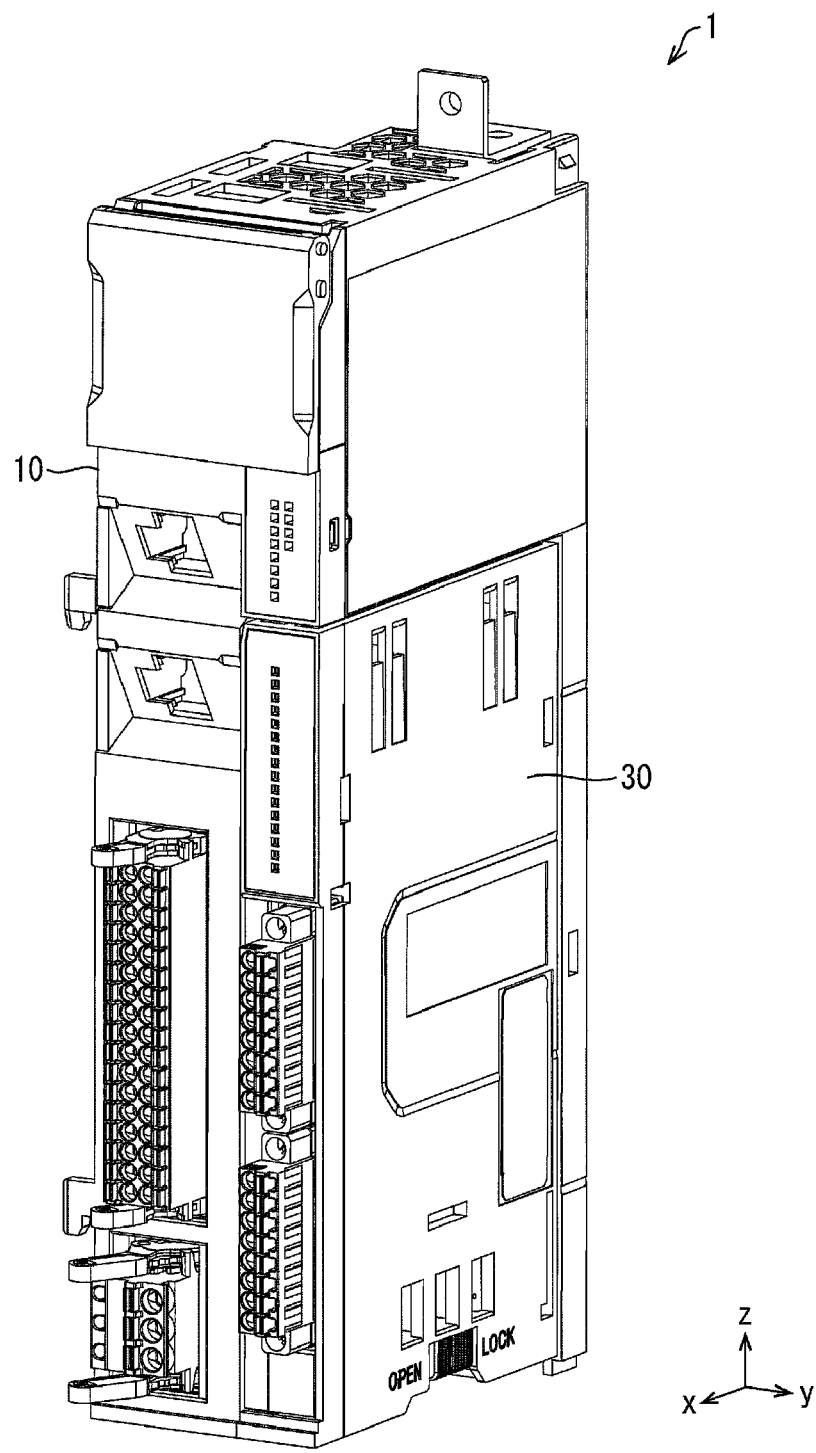
FIG. 1 shows a composition of an inverter unit according to an embodiment 1 of the present invention, and is a three-dimensional view obtained through viewing the inverter unit from the front right side.

Reference will now be made in detail to the present preferred embodiments of the invention, examples of which are illustrated in the accompanying drawings. Wherever possible, the same reference numbers are used in the drawings and the description to refer to the same or like parts.

The following describes a connection structure and an apparatus unit of the present invention with reference to the accompanying drawings.

[Embodiment 1]

A connection structure and an inverter unit 1 used as an apparatus unit in the embodiment 1 of the present invention are described in detail with reference to FIG. 1 to FIGS. 7(a)~7(c). Moreover, in this embodiment, the inverter unit is used as the apparatus unit, but the apparatus unit of the present invention is not limited thereto. The apparatus unit may be any apparatus unit provided that the apparatus unit is an apparatus unit having connectors between frame members required to be connected. For example, the apparatus unit may be an electrical connection box mounted in an automobile or the like.

(Inverter Unit 1)

The inverter unit 1 in this embodiment is described with reference to FIG. 1. FIG. 1 shows a composition of the inverter unit 1, and is a three-dimensional view obtained through viewing from the front right side. As shown in FIG. 1, the inverter unit 1 in this embodiment is roughly a cuboid, and is disposed in such a manner that the longest side is parallel to the up-down direction, the shortest side is parallel to the left-right direction, and other sides are parallel to the front-rear direction (the depth direction). In the following descriptions, the +x direction is used as the front direction, the −x direction is used as a rear direction, the +y direction is used as the right direction, the −y direction is used as the left direction, the +z direction is used as the up direction, and the −z direction is used as the down direction in FIG. 1. As shown in FIG. 1, the inverter unit 1 has an inverter body (a first frame member) 10 used as a main unit and a first option unit (a second frame member) 30 used as an option unit. The inverter unit 1 is connected to a device such as a motor. The following describes in detail the inverter body 10 and the first option unit 30.

(Inverter Body 10)

The inverter body 10 is the main unit of the inverter unit 1, and has a basic function as an inverter of the inverter unit 1.

Figure 2:
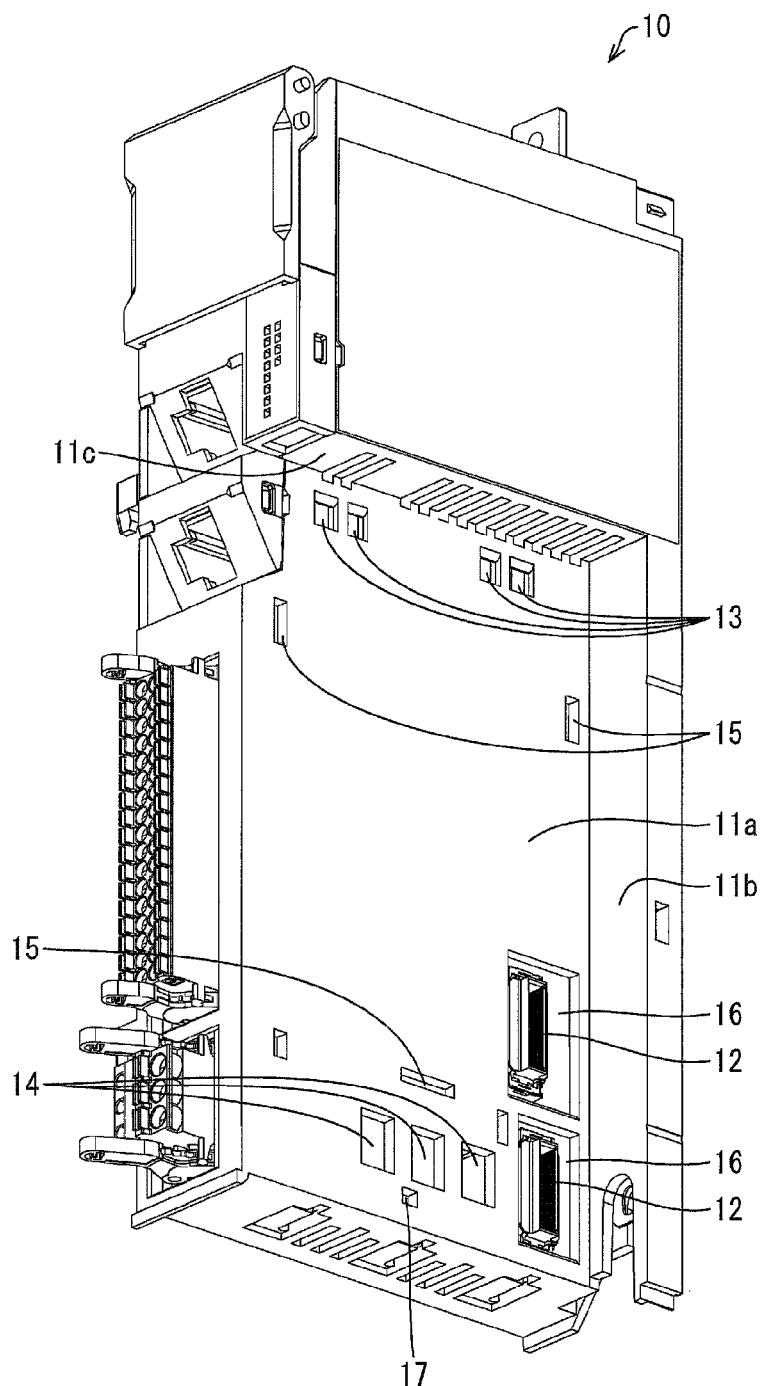
FIG. 2 is a three-dimensional view showing a composition of an inverter body of the inverter unit.

A composition of the inverter body 10 is described with reference to FIG. 2. FIG. 2 is a three-dimensional view showing the composition of the inverter body 10.

As shown in FIG. 2, the inverter body 10 is generally and roughly in a cuboid shape. The inverter body 10 on the right bottom front side lacks a shape of a part being a same shape as the first option unit 30, so that the first option unit 30 is mounted in the lacking position (referring to FIG. 1). The inverter body 10 has three surfaces enclosing the lacking position: a first mounting surface (a first connection surface) 11a, a second mounting surface 11b, and a third mounting surface 11c. The first mounting surface 11a is a surface provided with a first connector 12 described below, and is a side surface on the right when facing the paper side. The first mounting surface 11a is roughly in a rectangular shape using the up-down direction as a long side and using a front-rear direction as a short side. The second mounting surface 11b is a surface perpendicular to the first mounting surface 11a and connected to a long side at the rear side of the first mounting surface 11a, and is located on a rear surface side of the inverter body 10. The third mounting surface 11c is a surface perpendicular to the first mounting surface 11a and the second mounting surface 11b and connected to a short side at the upper side of the first mounting surface 11a.

In addition, the inverter body 10 has a printed board (not shown in the figure) received inside the inverter body 10, the first connector 12 connected to the printed board, a first opening portion 13, a second opening portion 14, a rib insertion hole 15, a wall portion insertion slot 16, and a protrusion insertion hole 17.

The first connector 12 is connected to a second connector 32 of the first option unit 30, and is a connector used for exchanging signals of the printed board of the inverter body 10 and a printed board of the first option unit 30.

The first connector 12 is disposed on the inner side of the first mounting surface 11a, and forms in such a manner that the first connector 12 does not protrude to the outside. In this way, when the first option unit 30 is not mounted in the inverter body 10, the first connector 12 can be prevented from being in contact with another object or the body of a user or the like. Therefore, damage to the first connector 12 can be avoided.

In addition, on the first mounting surface 11a, two first connectors 12 are disposed parallel to the second mounting surface 11b (that is, the direction of the long side of the first mounting surface 11a) and at an end portion in the direction of the long side opposite to the third mounting surface 11c. However, in the connection structure of the present invention, the number and configuration of first connectors 12 are not limited thereto. The number of first connectors 12 may be any number provided that the number s required for adding a new function for the inverter body 10. There may be one first connector 12, or may be at least three first connectors 12. In addition, multiple first connectors 12 may be disposed perpendicular to the second mounting surface 11b (that is, along the direction of the short side of the first mounting surface 11a).

The first connector 12 is a floating connector. Detailed information about the floating connector will be described below.

The first opening portion 13 is a rectangle-shaped opening portion formed on the first mounting surface 11a, and four first opening portions 13 are disposed along the direction of the short side of the first mounting surface 11a and at an end portion of a side close to the third mounting surface 11c in the direction of the long side of the first mounting surface 11a.

The second opening portion 14 is a rectangle-shaped opening portion formed on the first mounting surface 11a. On the first mounting surface 11a, three second opening portions 14 are disposed along the direction of the short side of the first mounting surface 11a and at an end portion (that is, an end portion of a side provided with the first connector 12) in the direction of the long side opposite to a side provided with the first opening portion 13.

The rib insertion hole 15 is a rectangle-shaped hole formed in the first mounting surface 11a. Three rib insertion holes 15 are disposed in the first mounting surface 11a. Of the three rib insertion holes 15, two rib insertion holes 15 are in elongated shapes in directions parallel to the direction of the long side of the first mounting surface 11a. Of the three rib insertion holes 15, the other rib insertion hole 15 is in an elongated shape in a direction perpendicular to the direction of the long side of the first mounting surface 11a.

The wall portion insertion slot 16 is a slot disposed in a rectangular shape in the first mounting surface 11a and around the first connector 12.

The protrusion insertion hole 17 is a hole formed in the first mounting surface 11a. The protrusion insertion hole 17 is disposed in the first mounting surface 11a and at the lower side of the second opening portion 14.

(First Option Unit 30)

The first option unit 30 is an option unit used for adding a function of the inverter body 10 of the inverter unit 1 for being used as the main unit. For example, the first option unit 30 is an option unit used for adding a security function, a function of a programmable controller (programmable controller), or the like.

Figure 3A:
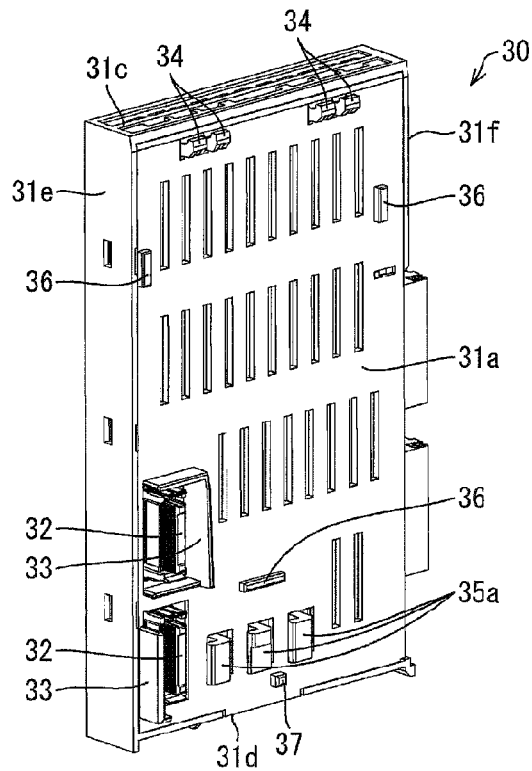
FIGS. 3(a) and 3(b) show a composition of a first option unit of the inverter unit.
Figure 3B:
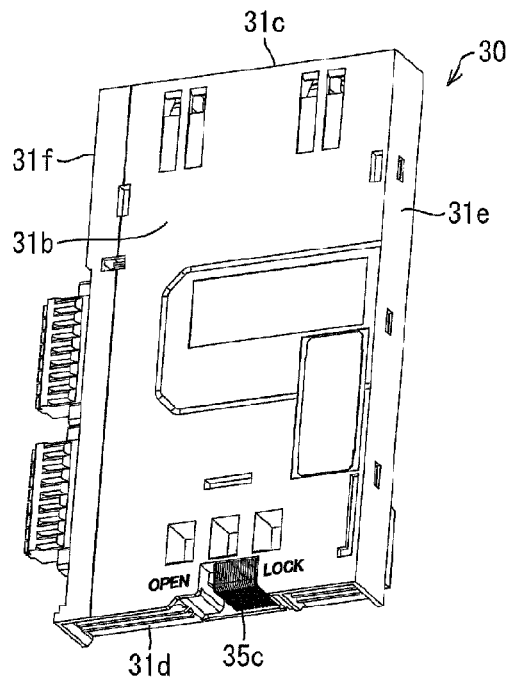

Subsequently, a composition of the first option unit 30 in this embodiment is described with reference to FIGS. 3(a) and 3(b). FIGS. 3(a) and 3(b) show a composition of the first option unit 30 in this embodiment, FIG. 3(a) is a three-dimensional view obtained through viewing the first option unit 30 from a side of a first side surface 31a, and FIG. 3(b) is a three-dimensional view obtained through viewing the first option unit 30 from a side of a second side surface 31b.

As shown in FIG. 3(a) and FIG. 3(b), the first option unit 30 uses a frame member roughly in a cuboid shape formed by the first side surface 31 (a second connection surface), the second side surface 31b (an inner surface), an upper surface 31c, a lower surface 31d, a rear surface 31e, and a front surface 31f as a basic composition. The first side surface 31a is a surface opposite to the first mounting surface 11a of the inverter body 10 when the first option unit 30 has been mounted in the inverter body 10, and is in a rectangular shape roughly having a same size as the first mounting surface 11a. The second side surface 31b is a surface opposite to the first side surface 31a. The upper surface 31c is a surface opposite to the third mounting surface 11c of the inverter body 10 when the first option unit 30 has been mounted in the inverter body 10, and is in a rectangular shape roughly having a same size as the third mounting surface 11c. The lower surface 31d is a surface opposite to the upper surface 31c. The rear surface 31e is a surface opposite to the second mounting surface 11b of the inverter body 10 when the first option unit 30 has been mounted in the inverter body 10, and is in a rectangular shape roughly having a same size as the second mounting surface 11b. The front surface 31f is a surface opposite to the rear surface 31e.

In addition, the first option unit 30 has a printed board (not shown in the figure) received inside the first option unit 30 and used for adding a function to the inverter body 10, the second connector 32 connected to the printed board, a wall portion 33, a fixing claw (a first engaging portion) 34, a fixing mechanism 35, a rib 36, and a protrusion 37.

The second connector 32 is connected to the first connector 12 connected to a printed board disposed inside the inverter body 10, and is a connector used for electrically connecting the printed board (not shown in the figure) of the inverter body 10 and the printed board of the first option unit 30.

In this embodiment, second connectors 32 are separately disposed on the first side surface 31a in a position opposite to two first connectors 12 when the first option unit 30 has been mounted in the inverter body 10. Specifically, on the first side surface 31a, two second connectors 32 are disposed at an end portion in the direction of the long side on a side provided with the lower surface 31d. However, the second connector 32 may not necessarily include the end portion disposed in the direction of the long side on the first side surface 31a.

In addition, the second connector 32 is disposed protruding to the outer side compared with the first side surface 31a. In this way, the second connector 32 may be connected to the first connector 12.

The second connector 32 is a floating connector. Herein, the floating connector is described. The floating connector is a connector formed in such a manner that one connector is movable relative to another connector. By means of the composition, if the connectors are connected to each other relative to one of the connectors that does not incline, the floating connector can cause the connectors to engage each other even if a slight deviation between the connector occurs. Therefore, the floating connector has an advantage of not easily releasing a connection between the connectors in a case of vibration, and the apparatus unit having connectors connected can be used in an environment of frequent vibration. It is found by the inventor et al. that, floating connectors are used as the first connector 12 and the second connector 32, and when the second connector 32 inclines relative to the first connector 12, the first connector 12 is connected to the second connector 32, no burden is caused to the first connector 12 and the second connector 32, and therefore, damage to the first connector 12 and the second connector 32 can be avoided. That is, the following technical idea is first found by the inventor et al.: in an inverter unit 1 not necessarily used in an environment of frequent vibration, floating connectors are used to avoid damage to the first connector 12 and the second connector 32.

The wall portion 33 is a member used for being inserted into the wall portion insertion slot 16 disposed around the first connector 12 when the first connector 12 is connected to the second connector 32, to locate the second connector 32 relative to the first connector 12. The wall portion 33 is disposed on the first side surface 31a in a position opposite to the wall portion insertion slot 16 of the inverter body 10 when the first option unit 30 has been mounted in the inverter body 10. The wall portion 33 is in a structure protruding (vertically disposed) from the first side surface 31a. The wall portion 33 is separately disposed in two second connectors 32. In this embodiment, in one second connector 32, the wall portion 33 is disposed on three surfaces of four surfaces around the second connector 32, and in another second connector 32, the wall portion 33 is disposed on one surface of four surfaces around the second connector 32. A top end portion of the wall portion 33 is in a shape with an arc (R-shaped). In this way, it becomes easy to insert the wall portion 33 into the wall portion insertion slot 16. In addition, even if the second connector 32 is not connected to the first connector 12, the wall portion 33 also has a function of being used as a protection wall for protecting the second connector 32.

Figure 5:
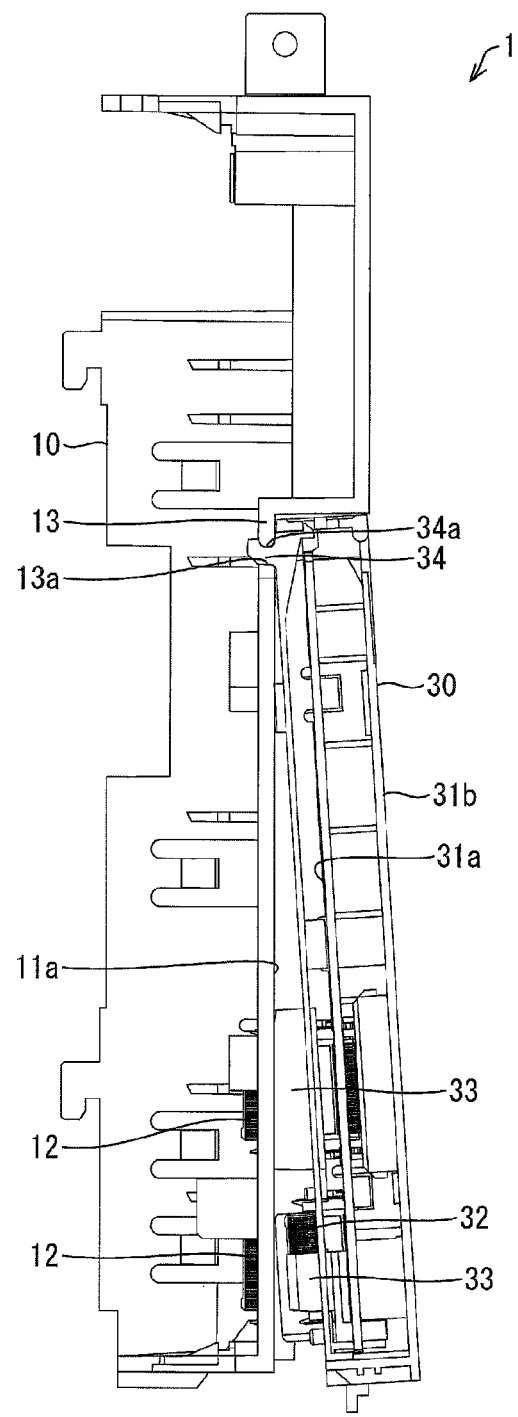
FIG. 5 is a front view showing a case in which the first option unit is mounted in the inverter body.

The fixing claw 34 is in a claw shape (referring to FIG. 5) provided with a recessed portion 34a, and is disposed protruding from the first side surface 31a. In addition, as shown in FIG. 5, when the first option unit 30 has been mounted in the inverter body 10, the recessed portion 34a engages a circumferential wall (an engaging support portion) 13a on a side of the third mounting surface 11c in a circumferential wall of the first opening portion 13, and the first option unit 30 can rotate relative to the inverter body 10 by using an engaging position as a pivot point.

The fixing claw 34 is disposed in a position opposite to the first opening portion 13 of the inverter body 10 when the first option unit 30 has been mounted in the inverter body 10. Specifically, in the direction of the long side of the first side surface 31a, four fixing claws 34 are disposed at an end portion opposite to a side provided with the second connector 32. In this embodiment, four fixing claws 34 are disposed, but this embodiment is not limited thereto. There may be one fixing claw 34, or may be at least two fixing claws 34. To cause the first connector 12 to be actually connected to the second connector 32, preferably, at least two fixing claws 34 are disposed.

Figure 4:
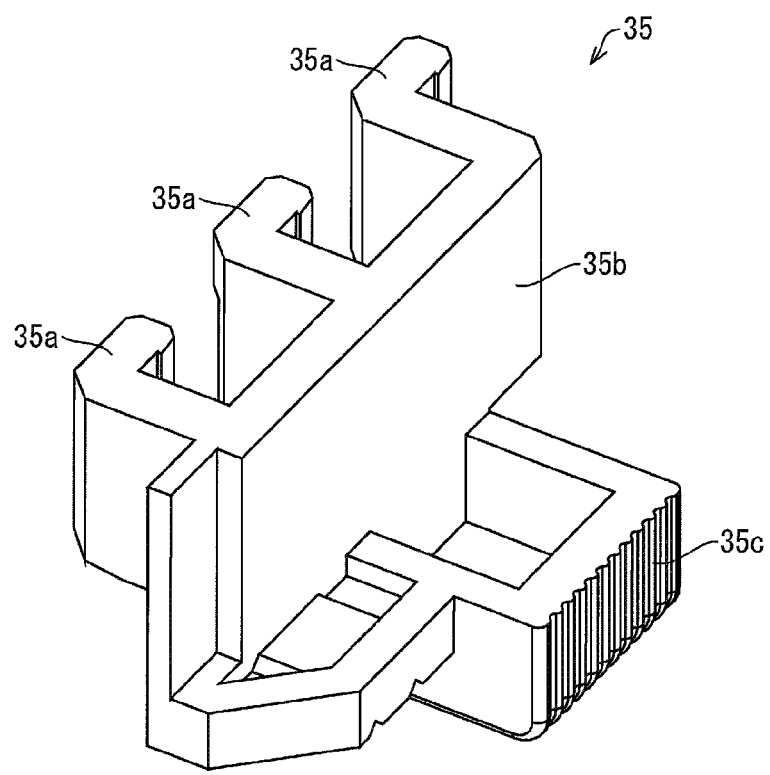
FIG. 4 is a three-dimensional view showing a fixing mechanism of the first option unit.

The fixing mechanism 35 is a mechanism used for fixing the first option unit 30 to be mounted in the inverter body 10 when the first option unit 30 has been mounted in the inverter body 10 (in other words, when the first connector 12 has been connected to the second connector 32). A composition of the fixing mechanism 35 is described with reference to FIGS. 3(a), 3(b) and FIG. 4. FIG. 4 is a three-dimensional view showing the composition of the fixing mechanism 35. As shown in FIG. 4, the fixing mechanism 35 has a movable claw (a second engaging portion) 35a, a flat plate 35b, and a slide block (an operating portion) 35c.

The movable claw 35a is in a hook shape, and is mounted in the flat plate 35b. The movable claw 35a is disposed in a position, on the first side surface 31a, opposite to the second opening portion 14 of the inverter body 10, and protruding from the first side surface 31a to the outer side. In this embodiment, three movable claws 35a are disposed, but this embodiment is not limited thereto. There may be one movable claw 35a, or may be at least two movable claws 35a.

The flat plate 35b is disposed inside the first option unit 30, and is operated by using the slide block 35c. In this way, the flat plate 35b may move in the direction of the short side of the first side surface 31a.

The slide block 35c is a movable portion used for moving the movable claw 35a and the flat plate 35b, and may move in the direction of the short side of the first side surface 31a. Specifically, the slide block 35c may move to an open position (the left side in FIG. 3(b)) and a close position (the right side in FIG. 3(b)).

In addition, as shown in FIG. 3(b), the slide block 35c in the second side surface 31b and the lower surface 31d is exposed to the outside. In this way, an operation can be performed on the slide block 35c from two directions of a side of the second side surface 31b and a side of the lower surface 31d.

The rib 36 is a mechanism used for being inserted into the rib insertion hole 15 of the inverter body 10, to bear shear loading when the first option unit 30 is mounted in the inverter body 10. The rib 36 is disposed protruding from the first side surface 31a. In this embodiment, three ribs 36 are disposed.

Two of the three ribs 36 are in elongated shapes in directions parallel to the direction of the long side of the first side surface 31a, and the remaining one of the three ribs 36 is in an elongated shape in a direction perpendicular to the direction of the long side of the first side surface 31a.

The rib 36 is inserted into the rib insertion hole 15, so that the rib 36 can bear shearing load in the directions of the long side and the short side of the first side surface 31a. In this way, a position offset of the first option unit 30 relative to the inverter body 10 caused by shearing load can be avoided.

In addition, the rib 36 also has the following function: the rib 36 is inserted into the rib insertion hole 15 of the first mounting surface 11a of the inverter body 10, so that when the first option unit 30 is mounted in the inverter body 10, a position offset of the first option unit 30 relative to the inverter body 10 is avoided.

The protrusion 37 is a protrusion disposed protruding from the first side surface 31a. The protrusion 37 is disposed on the first side surface 31a in a position opposite to the protrusion insertion hole 17 of the inverter body 10 when the first option unit 30 has been mounted in the inverter body 10.

(Connection Structure and Connection Action)

Figure 6:
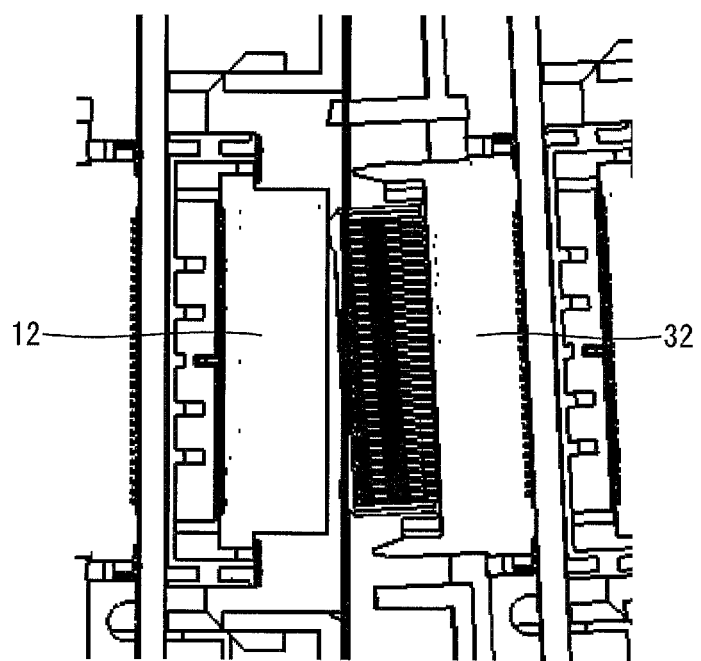
FIG. 6 is an enlarged view showing a case in which a second connector of he first option unit is connected to a first connector of the inverter body.

Subsequently, the connection structure in this embodiment and an action of connecting the first connector 12 and the second connector 32 by using the connection structure are described with reference to FIG. 1, FIG. 5, and FIG. 6. FIG. 5 is a front view showing a case in which the first option unit 30 is mounted in the inverter body 10. FIG. 6 is an enlarged view showing a case in which the second connector 32 is connected to the first connector 12.

In the action of connecting the first connector 12 and the second connector 32, first, it is determined whether the slide block 35c of the fixing mechanism 35 is in an open position. When the slide block 35c is not in the open position, the slide block 35c is caused to move to the open position.

Subsequently, as shown in FIG. 5, the fixing claw 34 of the first option unit 30 is inserted into the first opening portion 13 of the inverter body 10, and the recessed portion 34a of the fixing claw 34 is caused to engage the circumferential wall 13a. In this way, the first option unit 30 can rotate relative to the inverter body 10 by using an engaging position as a pivot point. Moreover, when the fixing claw 34 of the first option unit 30 is inserted into the first opening portion 13 of the inverter body 10, the rear surface 31e and the upper surface 31c of the first option unit 30 respectively press against the second mounting surface 11b and the third mounting surface 11c of the inverter body 10. In this way, the fixing claw 34 can be actually inserted into the corresponding first opening portion 13. That is, the second mounting surface 11b of the inverter body 10 functions as a guiding surface for a position, in a front-rear direction, of the first option unit 30 relative to the inverter body 10. Similarly, the third mounting surface 11c of the inverter body 10 functions as a guiding surface for a position, in an up-down direction, of the first option unit 30 relative to the inverter body 10.

Subsequently, the recessed portion 34a of the fixing claw 34 is caused to engage the circumferential wall 13a of the first opening portion 13, so that the first option unit 30 rotates towards the inverter body 10 by using the engaging position as a pivot point. Herein, a top end of the circumferential wall 13a is in a shape with an arc. In this way, engaging to the recessed portion 34a of the fixing claw 34 is easy, and the first option unit 30 easily rotates relative to the inverter body 10.

If the first option unit 30 is caused to rotate towards the inverter body 10, first, the wall portion 33 is inserted into the wall portion insertion slot 16. In this way, when the first connector 12 is connected to the second connector 32, a position of the second connector 32 relative to the first connector 12 may be accurately located.

Subsequently, the first option unit 30 is further caused to rotate towards the inverter body 10, and the second side surface 31b of the first option unit 30 is pressed towards the inverter body 10. In this way, as shown in FIG. 1, the first option unit 30 is mounted in the inverter body 10. In this way, the second connector 32 is inserted into the first connector 12, so that the first connector 12 is connected to the second connector 32.

Herein, the first option unit 30 is caused to rotate towards the inverter body 10 by using the engaging position between the recessed portion 34a and the circumferential wall 13a of the fixing claw 34 as the pivot point, so that the first connector 12 is connected to the second connector 32. Therefore, as shown in FIG. 6, the second connector 32 is connected to the first connector 12 in a state of inclining relative to the first connector 12. However, in the connection structure of this embodiment, as described above, the first connector 12 and the second connector 32 are floating connectors. Therefore, no burden is caused to the first connector 12 and the second connector 32. Therefore, damage to the first connector 12 and the second connector 32 can be avoided.

In addition, as described above, the circumferential wall 13a and the fixing claw 34 are respectively located close to upper ends of the first mounting surface 11a and the first side surface 31a in a rough rectangle shape that use an up-down direction as a direction of a long side, and the first connector 12 and the second connector 32 are respectively located close to lower ends of the first mounting surface 11a and the first side surface 31a. In this way, a slope of the second connector 32 relative to the first connector 12 when the first option unit 30 is caused to rotate towards the inverter body 10 can be reduced.

In addition, when the first option unit 30 is mounted in the inverter body 10, the movable claw 35a of the fixing mechanism 35 and the rib 36 are respectively inserted into the corresponding second opening portion 14 and rib insertion hole 15.

Moreover, the inverter unit 1 of this embodiment has a composition in which the first option unit 30 has the fixing claw 34 on the first side surface 31 and the inverter body 10 has the circumferential wall 13a engaging the fixing claw 34 on the first mounting surface 11. However, the inverter unit of the present invention is not limited thereto. For example, a composition may also be such that the fixing claw is disposed on the upper surface 31c of the first option unit 30, and the circumferential wall (the first opening portion) engaging the fixing claw is disposed on the third mounting surface 11c of the inverter body 10. By means of a composition disposed in such a manner that the fixing claw 34 is disposed on the first side surface 31a of the first option unit 30 and the circumferential wall 13 (the first opening portion) is disposed on the first mounting surface 11a of the inverter body 10, the engaging position between the fixing claw 34 and the circumferential wall 13a and a surface provided with the first connector 12 and the second connector 32 are on a same surface. Therefore, a position offset between the first connector 12 and the second connector 32 may be avoided in a rotation action for connecting the first connector 12 and the second connector 32.

Figure 7A:
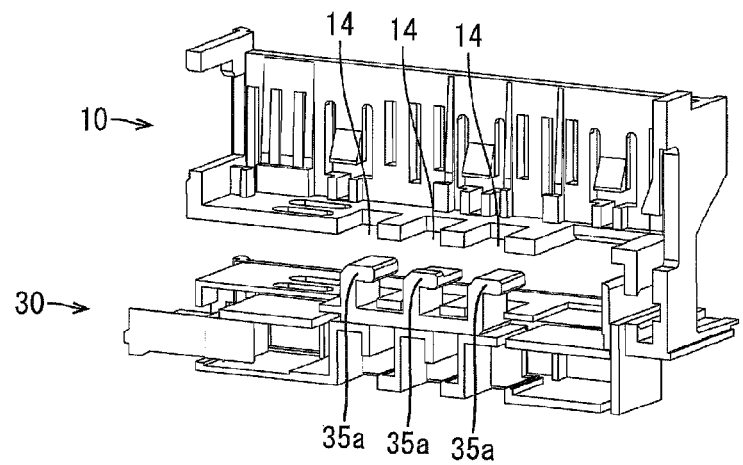
FIGS. 7(a)~7(c) illustrate an action of fixing the first option unit relative to the inverter body.
Figure 7B:
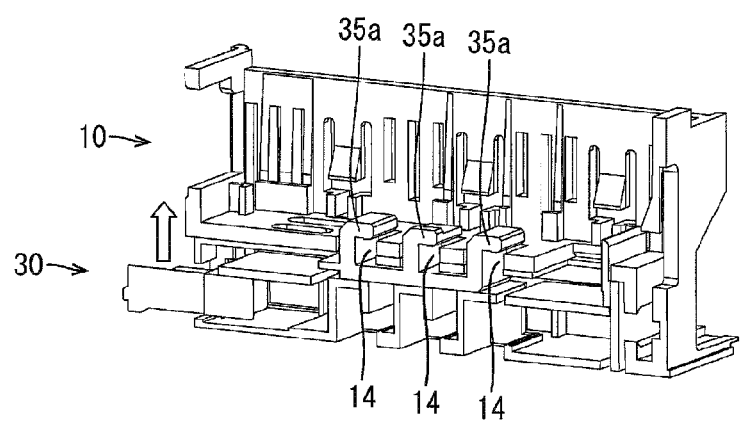
Figure 7C:
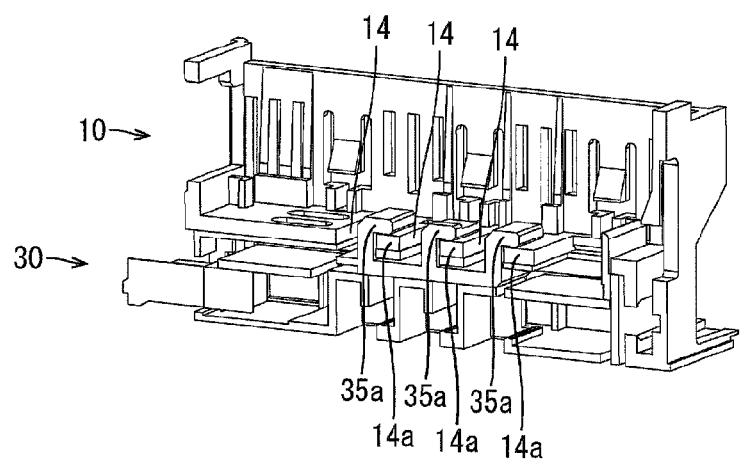

Subsequently, the fixing mechanism 35 is used to fix the first option unit 30 to the inverter body 10. Herein, an action of fixing the first option unit 30 relative to the inverter body 10 by using the fixing mechanism 35 is described in detail with reference to FIGS. 7(a)~7(c). FIGS. 7(a)~7(c) illustrate the action of fixing the first option unit 30 relative to the inverter body 10, FIG. 7(a) is a view showing a case before the first option unit 30 is mounted in the inverter body 10, FIG. 7(b) is a view showing a case after the first option unit 30 is mounted in the inverter body 10, and FIG. 7(c) is a view showing a case in which the first option unit 30 has been fixed in the inverter body 10. Moreover, FIGS. 7(a)~7(c) are drawings when a mechanism relative to the fixing mechanism 35 is viewed from the upper side.

Before the first option unit 30 is mounted in the inverter body 10, the slide block 35c of the fixing mechanism 35 is in the open position, and as shown in FIG. 7(a), the movable claw 35a is in a position (an unlock position) that can be inserted into the second opening portion 14 of the inverter body 10.

Subsequently, as shown in FIG. 7(b), the first option unit 30 is caused to rotate towards the inverter body 10 (that is, towards the direction of the arrow in the figure), to insert the movable claw 35a into the second opening portion 14 of the inverter body 10.

Subsequently, the slide block 35c is caused to move to the close position. In this way, as shown in FIG. 7(c), the movable claw 35a moves to a position (the lock position) engaging the circumferential wall 14a of the second opening portion 14 of the inverter body 10. Therefore, the first option unit 30 can no longer rotate relative to the inverter unit 10. That is, mounting of the first option unit 30 in the inverter body 10 may be fixed.

In addition, as shown in FIG. 1, when the first option unit 30 has been mounted in the inverter body 10, a shape formed by the first option unit 30 and the inverter body 10 is in a rough rectangle shape, thereby becoming a simple shape. In this way, if multiple inverter units 1 are connected to a motor or the like, space for configuring the multiple inverter units 1 can be reduced, thereby efficiently utilizing the space.

In this way, the connection structure of this embodiment is a connection structure connecting the first connector 12 and the second connector 32, the first connector 12 is disposed on the first mounting surface 11a of the inverter body 10, and the second connector 32 is disposed in a position, on the first side surface 31a of the first option unit 30 in contact with the first mounting surface 11a in a connected state, and opposite to the first connector 12 in the connected state. In the connection structure of this embodiment, the first option unit has the fixing claw 34 at the end portion of the first side surface 31a, the inverter body 10 has the circumferential wall 13a on the first mounting surface 11a, and the circumferential wall 13a engages the fixing claw 34, so that the first option unit 30 rotates by using the engaging position as the pivot point. In addition, the first option unit 30 is caused to rotate towards the inverter body 10, to connect the first connector 12 and the second connector 32. In addition, the connection structure of this embodiment is characterized in that: the first connector 12 and the second connector 32 are floating connectors.

In the connection structure having the characteristic, the first connector 12 and the second connector 32 are floating connectors. In this way, when the second connector 32 is connected to the first connector 12 in a state of inclining relative to the first connector 12, no burden is caused to the first connector 12 and the second connector 32. Therefore, damage to the first connector 12 and the second connector 32 can be avoided.

In addition, the inverter unit 1 used as the apparatus unit of this embodiment is an apparatus unit having the inverter body 10 provided with the first connector 12 and the first option unit 30 provided with the second connector 32, and the first connector 12 disposed in the inverter body 10 is connected to the second connector 32 disposed in the first option unit 30 by using the connection structure.

[Embodiment 2]

Another embodiment of the present invention is described as follows. Moreover, for ease of description, for a mechanism having a same function as a mechanism described in the embodiment, a same symbol is added and a description thereof is omitted.

An inverter unit 1A in this embodiment is different from the inverter unit 1 in the embodiment 1 in the following aspect: another option unit may be further mounted on the second side surface of the first option unit in the inverter unit 1 of the embodiment 1.

(Inverter Unit 1A)

The inverter unit 1A in this embodiment is described based on FIG. 8 to FIGS. 12(a)-12(b).

Figure 8:
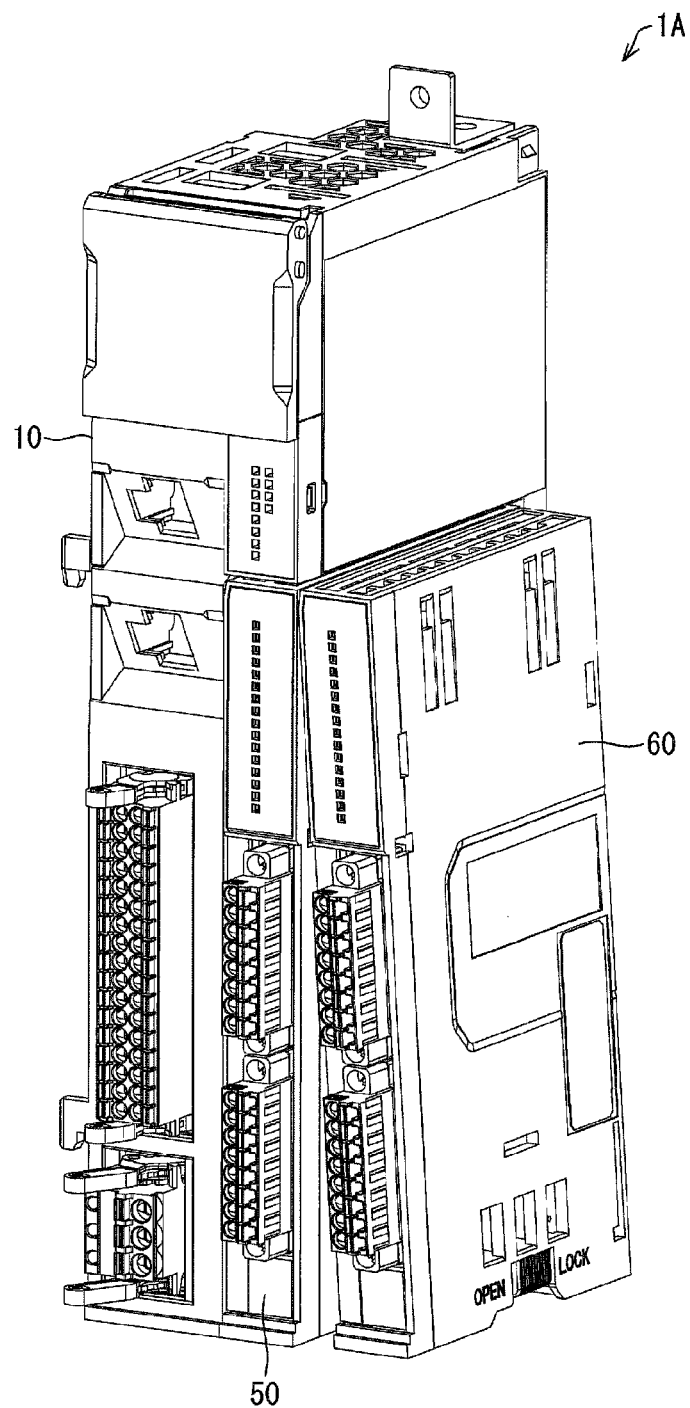
FIG. 8 shows a composition of an inverter unit according to an embodiment 2 of the present invention, and is a three-dimensional view showing a case in which a second option unit is further mounted when a first option unit has been mounted in an inverter body.

FIG. 8 shows a composition of the inverter unit 1A in this embodiment, and is a three-dimensional view showing a case in which a second option unit 60 is further mounted when a first option unit 50 has been mounted in an inverter body 10.

As shown in FIG. 8, the inverter unit 1A in this embodiment has the inverter body 10 being used as a main unit, the first option unit 50 being used as an option unit, and the second option unit 60. The inverter body 10 is the same as the inverter body 10 in the embodiment 1, and therefore, a description thereof is omitted. The following describes the first option unit 50 and the second option unit 60 in this embodiment.

(First Option Unit 50 and Second Option Unit 60)

The first option unit 50 and the second option unit 60 in this embodiment are described.

Because the first option unit 50 and the second option unit 60 have a same structure and function, only the first option unit 50 is described. In addition, in the following descriptions, mechanisms of the second option unit 60 and mechanisms of the first option unit 50 are described by using same numbers.

Figure 9A:
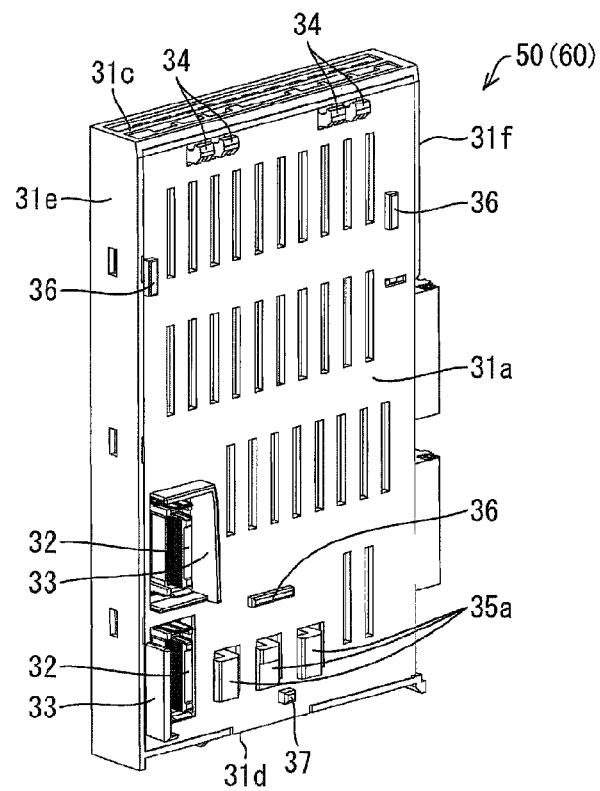
FIGS. 9(a) and 9(b) show a composition of the first option unit of the inverter unit.
Figure 9B:
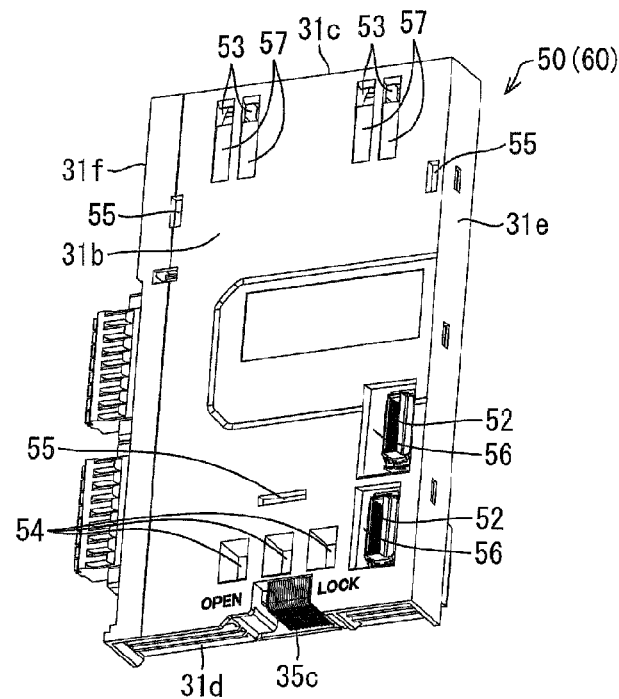
Figure 10:
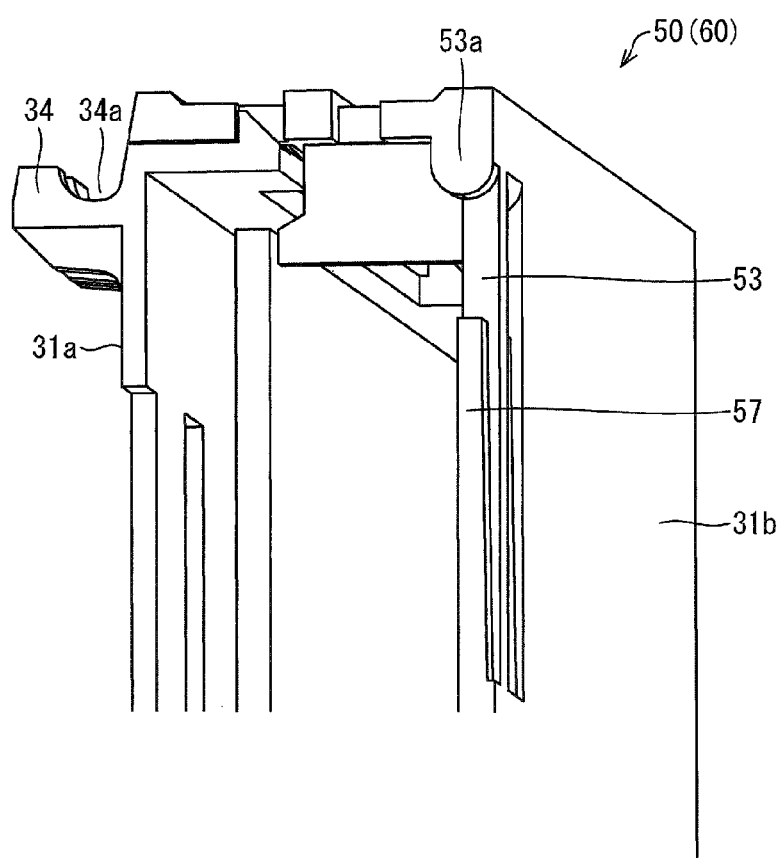
FIG. 10 is a cross-sectional view obtained through cutting the first option unit by using a surface passing through a fixing claw and parallel to a front surface.

A composition of the first option unit 50 in this embodiment is described with reference to FIGS. 9(a), 9(b). FIGS. 9(a) and 9(b) show a composition of the first option unit 50 in this embodiment, FIG. 9(a) is a three-dimensional view obtained through viewing the first option unit 50 from a side of a first side surface 31a, and FIG. 9(b) is a three-dimensional view obtained through viewing the first option unit 50 from a side of a second side surface 31b. FIG. 10 is a cross-sectional view obtained through cutting the first option unit 50 by using a surface passing through a fixing claw 34 and parallel to a front surface 31f.

As shown in FIG. 9(b) and FIG. 10, the first option unit 50 has the composition elements of the first option unit 30 in the embodiment 1, and has, on the second side surface 31b, a third connector 52, a first opening portion 53, a circumferential wall 53a, a second opening portion 54, a rib insertion hole 55, and a wall portion insertion slot 56 that have same structures and functions as the first connector 12, the first opening portion 13, the circumferential wall 13a, the second opening portion 14, the rib insertion hole 15, and the wall portion insertion slot 16 of the inverter body 10 in the embodiment 1. In addition, the first option unit 50 in this embodiment further has a fixing claw guiding slot 57 on the second side surface 31b. Moreover, the number of third connectors 52 may be any number provided that the number is required for adding a new function for the inverter body 10. There may be one third connector 52, or may be at least three connectors 52.

The fixing claw guiding slot 57 is a slot used for guiding the fixing claw 34 of the second option unit 60 to the first opening portion 53 of the first option unit 50 when the fixing claw 34 of the second option unit 60 is inserted into the first opening portion 53 of the first option unit 50. As shown in FIG. 9(b) and FIG. 10, the fixing claw guiding slot 57 is disposed across the first opening portion 53, from a side opposite to the circumferential wall 53a, and along a direction of a long side of the second side surface 31b. The fixing claw guiding slot 57 is in a shape that the second side surface 31b is recessed to the inside of the first option unit 50.

(Connection Structure and Connection Action)

Subsequently, the connection structure and the connection action in this embodiment are described. In this embodiment, a first connector 12 of the inverter body 10 is connected to a second connector 32 of the first option unit 50, and the third connector 52 of the first option unit 50 is connected to the second connector 32 of the second option unit 60. In the following descriptions, for convenience, a connection structure in which the first connector 12 of the inverter body 10 is connected to the second connector 32 of the first option unit 50 is referred to as a first connection structure, and a connection structure in which the third connector 52 of the first option unit 50 is connected to the second connector 32 of the second option unit 60 is referred to as a second connection structure.

The connection structure (that is, the first connection structure) in which the first connector 12 of the inverter body 10 is connected to the second connector 32 of the first option unit 50 is the same as the connection between the first connector 12 of the inverter body 10 and the second connector 32 of the first option unit 30 in the embodiment 1, and therefore, a description thereof is omitted.

Subsequently, the connection structure (that is, the second connection structure) in which the third connector 52 of the first option unit 50 is connected to the second connector 32 of the second option unit 60 and a connection action are described.

In the connection action of connecting the third connector 52 of the first option unit 50 and the second connector 32 of the second option unit 60, first, it is determined whether a slide block 35c of a fixing mechanism 35 of the second option unit 60 is in an open position. If the slide block 35c is not in the open position, the slide block 35c is caused to move to the open position.

Subsequently, the fixing claw 34 of the second option unit 60 is inserted into the first opening portion 53 of the first option unit 50, and a recessed portion 34a of the fixing claw 34 of the second option unit 60 is caused to engage the circumferential wall 53a of the first option unit 50. In this way, the second option unit 60 can rotate relative to the first option unit 50 by using an engaging position as a pivot point. Herein, the second side surface 31b of the first option unit 50 is provided with the fixing claw guiding slot 57. In this way, when the fixing claw 34 of the second option unit 60 is inserted into the first opening portion 53 of the first option unit 50, one side the fixing claw 34 of the second option unit 60 may be caused to be inserted into the first opening portion 53 of the first option unit 50 along one side of the fixing claw guiding slot 57. In this way, the fixing claw 34 of the second option unit 60 can be actually inserted into the corresponding first opening portion 53.

Subsequently, the recessed portion 34a of the fixing claw 34 of the second option unit 60 is caused to engage the circumferential wall 53a of the first opening portion 53 of the first option unit 50, so that the second option unit 60 rotates towards the first option unit 50 by using the engaging position as a pivot point.

If the second option unit 60 is caused to rotate towards the first option unit 50, first, the wall portion 33 of the second option unit 60 is inserted into the wall portion insertion slot 56 of the first option unit 50. In this way, a position of the second connector 32 of the second option unit 60 relative to the third connector 52 of the first option unit 50 can be accurately located.

Subsequently, the second option unit 60 is further caused to rotate towards the first option unit 50, and the second side surface 31b of the second option unit 60 is pressed towards the first option unit 50. In this way, the second option unit 60 is mounted in the first option unit 50. In this way, the second connector 32 of the second option unit 60 is inserted into the third connector 52 of the first option unit 50, so that the third connector 52 of the first option unit 50 is connected to the second connector 32 of the second option unit 60.

Figure 11A:
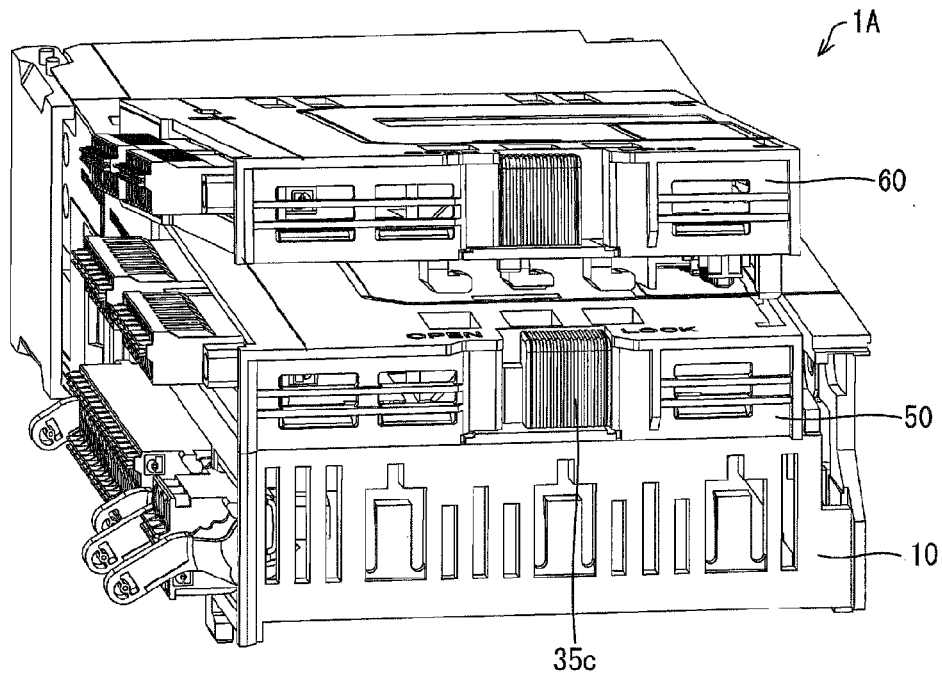
FIGS. 11(a)~11(c) show a case in which a second option unit is mounted in the first option unit if a slide block of a fixing mechanism of the first option unit is in a lock position.
Figure 11B:
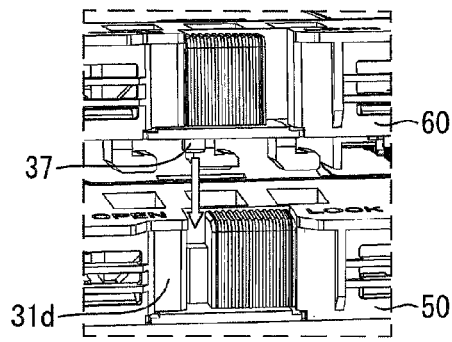
Figure 11C:
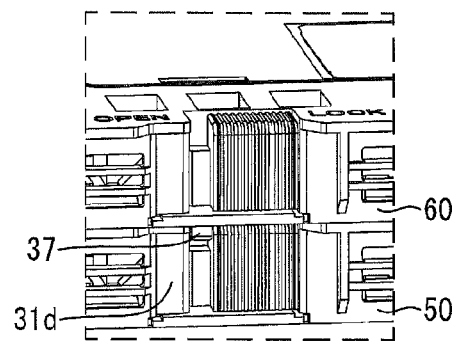
Figure 12A:
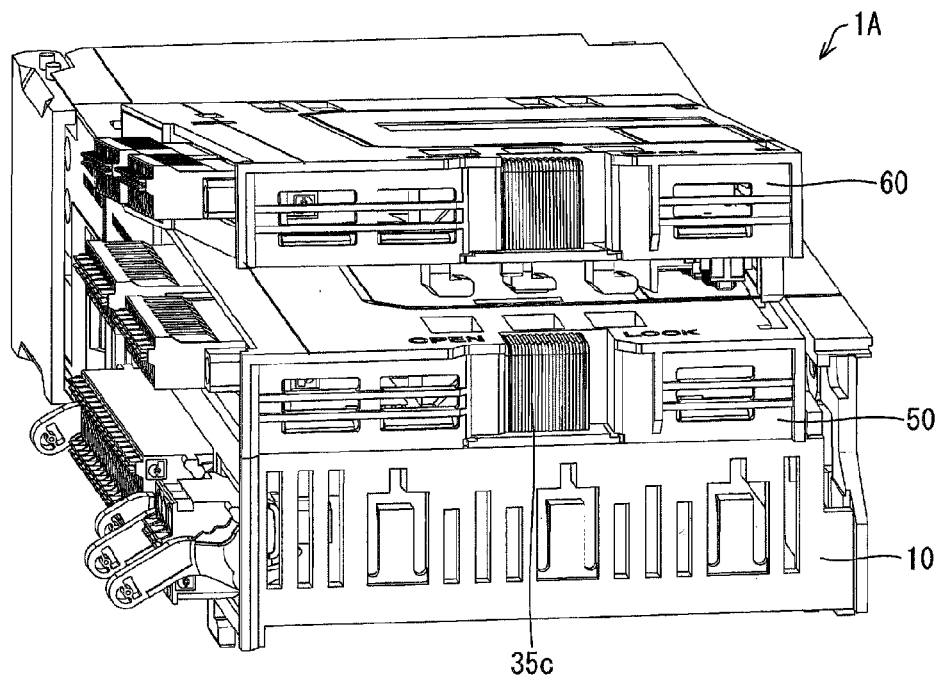
FIGS. 12(a) and 12(b) shows a case in which the second option unit is mounted in the first option unit if the slide block of the fixing mechanism of the first option unit is in an open position.

Herein, a lock forgetting avoiding structure of the fixing mechanism 35 of the first option unit 50 is described with reference to FIGS. 11(a)~11(c) and FIGS. 12(a), 12(b). FIGS. 11(a)~11(c) show a case in which a second option unit 60 is mounted in the first option unit 50 when a slide block 35c of a fixing mechanism 35 of the first option unit 50 is in a close position, FIG. 11(a) is a view obtained through viewing from the bottom side a case in which the second option unit 60 is mounted in the first option unit 50, FIG. 11(b) is an enlarged view of the fixing mechanism 35 of the first option unit 50 in FIG. 11(a), and FIG. 11(c) is an enlarged view of the fixing mechanism 35 of the first option unit 50 when the second option unit 60 has been mounted in the first option unit 50. FIGS. 12(a). 12(b) show a case in which the second option unit 60 is mounted in the first option unit 50 when the slide block 35c of the fixing mechanism 35 of the first option unit 50 is in an open position, FIG. 12(a) is a view obtained through viewing from the bottom side a case in which the second option unit 60 is mounted in the first option unit 50, and FIG. 12(b) is an enlarged view of the fixing mechanism 35 of the first option unit 50 in FIG. 12(a).

As shown in FIG. 11(a) and FIG. 11(b), if the second option unit 60 is mounted in the first option unit 50, the slide block 35c of the fixing mechanism 35 of the first option unit 50 is generally in the close position (the right side in FIG. 11(a) and FIG. 11(b)). If the slide block 35c of the fixing mechanism 35 of the first option unit 50 is in the close position, as shown in FIG. 11(b) and FIG. 11(c), if the second option unit 60 is caused to rotate towards the first option unit 50 (along the direction of the arrow in FIG. 11(b)), the protrusion 37 is inserted between the slide block 35c of the fixing mechanism 35 of the first option unit 50 and the lower surface 31d. In this way, the second option unit 60 can be mounted in the first option unit 50.

Figure 12B:
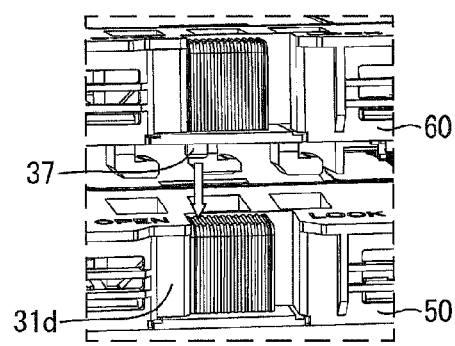

On the other hand, as shown in FIG. 12(a) and FIG. 12(b), after the first option unit 50 is mounted in the inverter body 10, if a user forgets to move the slide block 35c of the fixing mechanism 35 of the first option unit 50 to the close position, the slide block 35c of the fixing mechanism 35 of the first option unit 50 is in the open position. In this state, if the second option unit 60 is caused to rotate towards the first option unit 50 (along the direction of the arrow in FIG. 12(b)), the protrusion 37 is in contact with (interferes with) the slide block 35c of the fixing mechanism 35 of the first option unit 50. As a result, the second option unit 60 cannot be mounted in the first option unit 50. In this way, after the first option unit 50 is mounted in the inverter body 10, a user can be prevented from forgetting to move the slide block 35c of the fixing mechanism 35 of the first option unit 50 to the close position Moreover, the slide block 35c is formed in such a manner that an operation can be performed on the slide block 35c from two directions of a side of the second side surface 31b and a side of the lower surface 31d. In this way, as shown in FIG. 11(c), even if an operation cannot be performed on the slide block 35c from the side of the second side surface 31b, an operation can be performed on the slide block 35c from the side of the lower surface 31d.

The third connector 52 of the first option unit 50 and the second connector 32 of the second option unit 60 in this embodiment are also floating connectors similar to the first connector 12 of the inverter body 10 and the second connector 32 of the first option unit 30 in the embodiment 1. Therefore, no burden is caused to the third connector 52 of the first option unit 50 and the second connector 32 of the second option unit 60. Therefore, damage to the third connector 52 of the first option unit 50 and the second connector 32 of the second option unit 60 can be avoided.

Subsequently, the slide block 35c of the fixing mechanism 35 of the second option unit 60 is caused to move to the close position, so as to fix the second option unit 60 to the first option unit 50.

By means of the foregoing descriptions, the third connector 52 of the first option unit 50 is connected to the second connector 32 of the second option unit 60.

In this way, the inverter unit 1A being used as the apparatus unit of this embodiment has the inverter body 10 (a frame member A), the first option unit 50 (a frame member B), and the second option unit 60 (a frame member C). The inverter body 10 has a first mounting surface 11a (a first surface) adjacent to the first option unit 50, the first option unit 50 has the first side surface 31a (a second surface) adjacent to the inverter body 10 and the second side surface 31b (a third surface) adjacent to the second option unit 60, and the second option unit 60 has the first side surface 31a (a fourth surface) adjacent to the first option unit 50. In the inverter unit 1A, the first connector 12 of the inverter body 10 is connected to the second connector 32 of the first option unit 50 by using the first connection structure, and the third connector 52 of the first option unit 50 is connected to the second connector 32 of the second option unit 60 by using the second connection structure.

In the second connection structure, the second option unit 60 includes the protrusion 37. In this way, after the first option unit 50 is mounted in the inverter body 10, if the user forgets to move the slide block 35c of the fixing mechanism 35 of the first option unit 50 to the close position, if the second option unit 60 is caused to rotate towards the first option unit 50, the protrusion 37 is in contact with (interferes with) the slide block 35c of the fixing mechanism 35 of the first option unit 50. As a result, the second option unit 60 cannot be mounted in the first option unit 50. In this way, after the first option unit 50 is mounted in the inverter body 10, the user can be prevented from forgetting to move the slide block 35c of the fixing mechanism 35 of the first option unit 50 to the close position.

The present invention is not limited to the described embodiments, but various modifications may be made within the scope shown in the claims, and embodiments obtained by combing the technical means separately disclosed in the different embodiments are also included in the technical scope of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A connection structure, connecting a first connector disposed on an inner side of a first connection surface of a first frame member to a second connector disposed on a second connection surface of a second frame member, wherein
   the second frame member comprises a first engaging portion,
   the first frame member comprises an engaging support portion, wherein the engaging support portion engages the first engaging portion, so that the second frame member rotates by using an engaging position as a pivot point,
   the first connector and the second connector are connected by rotating the second frame member towards the first frame member, and
   the first connector and the second connector are floating connectors, wherein
   the second frame member comprises a second engaging portion on the second connection surface, wherein the second engaging portion is movable between a lock position and an unlock position,
   the first frame member comprises a second opening portion on the first connection surface, wherein the second opening portion allows insertion of the second engaging portion located in the unlock position,
   when the first connector has been connected to the second connector, the second engaging portion engages a circumferential wall of the second opening portion by moving the second engaging portion to the lock position,
   the second frame member comprises an operatingortion wherein the operating portion is movable between an open position and a close position,
   the second engaging portion moves from the unlock position to the lock position by moving the operating portion from the open position to the close position,
   the second frame member comprises two planes different from the second connection surface, and
   the operating portion is exposed outside each of the two planes, the operating portion is adapted to be selectively operated from any of the two planes, in order to move between the open position and the close position, and the two planes are intersecting with each other.

2. The connection structure according to claim 1, wherein the first engaging portion is disposed on the second connection surface, and
   the engaging support portion is disposed on the first connection surface.

3. The connection structure according to claim 2, wherein the first connector is configured closer to an inner side than the first connection surface, and
   the second connector is configured protruding to an outer side compared with the second connection surface.

4. The connection structure according to claim 1, wherein the second frame member comprises, around the second connector, a wall portion protruding from the second connection surface to an outside, and
   the first frame member comprises, in a position on the first connection surface and opposite to the wall portion in a connected state, a wall portion insertion slot allowing insertion of the wall portion.

5. The connection structure according to claim 1, wherein the second frame member comprises a rib on the second connection surface, and
   the first frame member comprises, in a position on the first connection surface and opposite to the rib in a connected state, a rib insertion hole allowing insertion of the rib.

6. An apparatus unit, comprising multiple frame members, wherein
   connectors between adjacent frame members are connected to each other by using the connection structure according to claim 1.

7. An apparatus unit, comprising at least three frame members: a frame member A, a frame member B, and a frame member C, wherein
   the frame member A comprises a first surface adjacent to the frame member B,
   the frame member B comprises a second surface adjacent to the frame member A and a third surface adjacent to the frame member C, the frame member C comprises a fourth surface adjacent to the frame member B, connectors of the frame member A and the frame member B are connected to each other by using the connection structure according to claim 4 in which the first surface is used as the first connection surface and the second surface is used as the second connection surface, connectors of the frame member B and the frame member C are connected to each other by using the connection structure according to the said connection structure in which the third surface is used as the first connection surface and the fourth surface is used as the second connection surface, the frame member C comprises a protrusion on the fourth surface, when the operating portion of the frame member B is in an open position, the protrusion interferes with a side of the third surface of the operating portion, and when the operating portion of the frame member B is in the close position, the protrusion does not interfere with a side of the third surface of the operating portion.

* * * * *